(12) United States Patent
Sun et al.

(10) Patent No.: US 11,997,915 B2
(45) Date of Patent: May 28, 2024

(54) DISPLAY SUBSTRATE, METHOD FOR MANUFACTURING THE SAME, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Kuo Sun, Beijing (CN); Haijun Yin, Beijing (CN); Liqiang Chen, Beijing (CN); Jiafan Shi, Beijing (CN); Renrong Gai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 442 days.

(21) Appl. No.: 17/417,563

(22) PCT Filed: Nov. 16, 2020

(86) PCT No.: PCT/CN2020/129018
§ 371 (c)(1),
(2) Date: Jun. 23, 2021

(87) PCT Pub. No.: WO2021/098639
PCT Pub. Date: May 27, 2021

(65) Prior Publication Data
US 2022/0059784 A1    Feb. 24, 2022

(30) Foreign Application Priority Data
Nov. 21, 2019    (CN) .......................... 201911154500.X

(51) Int. Cl.
*H10K 77/10*    (2023.01)
*H10K 50/844*    (2023.01)
(Continued)

(52) U.S. Cl.
CPC ......... *H10K 77/111* (2023.02); *H10K 50/844* (2023.02); *H10K 71/00* (2023.02); *H10K 2102/311* (2023.02)

(58) Field of Classification Search
None
See application file for complete search history.

(56) References Cited

U.S. PATENT DOCUMENTS 9,268,368 B2    2/2016    Kang et al.
10,181,576 B2    1/2019    Chung et al.
(Continued)

FOREIGN PATENT DOCUMENTS

CN    104464540 A    3/2015
CN    107784940 A    3/2018
(Continued)

OTHER PUBLICATIONS

International Search Report dated Jan. 27, 2021, issued in counterpart International application No. PCT/CN2020/129018, with English translation. (10 pages).
(Continued)

*Primary Examiner* — Cory W Eskridge
(74) *Attorney, Agent, or Firm* — WHDA, LLP

(57) ABSTRACT

A display substrate, including: a main display area, including a main display surface; and a bending portion, disposed around a periphery of the main display area, the bending portion is connected to the periphery of the main display area and is bent in a direction away from the main display surface, the bending portion includes: a plurality of side display areas, each of which is connected to a side edge of
(Continued)

the main display area, and each side display area includes a side display surface; and a plurality of corner portions, each corner portion is connected to a turning of the main display area and is located between two adjacent side display areas, and wherein the main display surface and the side display surfaces constitute a display area, the corner portions constitute a non-display area, and the plurality of side display areas and the plurality of corner portions extend continuously.

13 Claims, 12 Drawing Sheets

(51) Int. Cl.
*H10K 71/00* (2023.01)
*H10K 102/00* (2023.01)

(56) References Cited

U.S. PATENT DOCUMENTS

| | | | |
|---|---|---|---|
| 10,198,028 | B2 | 2/2019 | Nagayama et al. |
| 10,347,176 | B2 | 7/2019 | Lee et al. |
| 10,939,547 | B2 | 3/2021 | Lee et al. |
| 10,990,133 | B2 | 4/2021 | Nakatogawa |
| 11,094,895 | B2 | 8/2021 | Dai |
| 2015/0138041 | A1 | 5/2015 | Hirakata et al. |
| 2018/0322826 | A1* | 11/2018 | Lee .................. G06F 1/1652 |
| 2019/0081127 | A1 | 3/2019 | Shim et al. |
| 2021/0359070 | A1 | 11/2021 | Jin |

FOREIGN PATENT DOCUMENTS

| | | |
|---|---|---|
| CN | 107819008 A | 3/2018 |
| CN | 108108062 A | 6/2018 |
| CN | 108766977 A | 11/2018 |
| CN | 108878475 A | 11/2018 |
| CN | 109659337 A | 4/2019 |
| CN | 110085552 A | 8/2019 |
| CN | 110189631 A | 8/2019 |
| CN | 110853518 A | 2/2020 |
| KR | 10-2017-0091287 A | 8/2017 |
| WO | 2019/012750 A1 | 1/2019 |

OTHER PUBLICATIONS

Written Opinion dated Jan. 27, 2021, issued in counterpart International application No. PCT/CN2020/129018. (5 pages).
Office Action dated Jan. 27, 2021, issued in counterpart CN application No. 201911154500.X, with English translation. (23 pages).
Office Action dated Aug. 12, 2021, issued in counterpart CN application No. 201911154500.X, with English translation. (15 pages).

* cited by examiner

A base substrate 3 is provided, the base substrate 3 includes a main display area 2 and a bending portion 4, the bending portion 4 is disposed around a periphery of the main display area 2, and the bending portion 4 includes a plurality of side display areas 41 and a plurality of corner portions 43 — S91

A display layer 6 is formed on the base substrate 3, so that the main display area 2 includes a main display surface 21, and each side display area 41 of the plurality of the side display area 41 includes a side display surface 411 — S92

The display layer 6 in the plurality of corner portions 43 is removed, so that the corner portions 43 constitute a non-display area — S93

The bending portion 4 including the plurality of side display areas 41 and the plurality of corner portions 43 is bent in a direction away from the main display surface 21 — S94

FIG. 9

DISPLAY SUBSTRATE, METHOD FOR MANUFACTURING THE SAME, AND DISPLAY PANEL

CROSS-REFERENCE TO RELATED APPLICATION

This application is a Section 371 National Stage Application of International Application No. PCT/CN2020/129018 filed on Nov. 16, 2020, entitled "DISPLAY SUBSTRATE, METHOD FOR MANUFACTURING THE SAME, AND DISPLAY PANEL", which claims priority to Chinese Application No. 201911154500.X, filed on Nov. 21, 2019, the content of which is incorporated herein by reference in their entirety.

TECHNICAL FIELD

The present disclosure relates to a field of display technology, and in particular to a display substrate, a method for manufacturing the display substrate, and a display panel.

BACKGROUND

With the development of electronic technology, electronic devices such as smart phones are used more and more frequently in users' lives, and electronic devices are becoming more and more important to users. Since display areas of large-screen mobile phones are larger, which is more in line with needs of users for browsing webs, reading books, watching movies, and playing games. Therefore, borders of current electronic devices are getting narrower and narrower to increase screen-to-body ratio and enhance users' experiences. For example, in order to achieve mobile phones with ultra-narrow bezels or even bezelless, smart phones with bending display solutions have gradually become a developing trend of mobile phones. However, effects of bending display devices adopted by electronic devices in the related art are not ideal, and there is room for improvement.

SUMMARY

In one aspect, a display substrate is provided, the display substrate includes:

a main display area, wherein the main display area includes a main display surface; and a bending portion, wherein the bending portion is disposed around a periphery of the main display area, the bending portion is connected to the periphery of the main display area, and the bending portion is bent in a direction away from the main display surface, wherein the bending portion includes:

a plurality of side display areas, wherein each side display area is connected to a side edge of the main display area, and each side display area includes a side display surface; and a plurality of corner portions, wherein each corner portion is connected to a turning of the main display area, and each corner portion is located between two adjacent side display areas, and wherein the main display surface and the side display surface together constitute a display area, the corner portions constitute a non-display area, and the plurality of side display areas and the plurality of corner portions extend continuously.

For example, the display substrate includes a flexible base substrate and a wiring disposed on the flexible base substrate, the wiring includes a first wiring portion, a second wiring portion and a third wiring portion that are extend continuously, the first wiring portion is located in one side display area of two adjacent side display areas, the third wiring portion is located in the other one side display area of the two adjacent side display areas, and the second wiring portion is located in the corner portion between the two adjacent side display areas.

For example, the display substrate further includes a buffer layer disposed on the flexible base substrate, and an orthographic projection of the buffer layer on the flexible base substrate does not overlap with an orthographic projection of the corner portion on the flexible base substrate.

For example, the first wiring portion and the third wiring portion contact a surface of the buffer layer away from the flexible base substrate, and the second wiring portion contacts a surface of the flexible base substrate.

For example, the display substrate further includes a display layer disposed on the flexible base substrate and an encapsulation layer disposed on a side of the display layer away from the flexible base substrate, and an orthographic projection of each of the display layer and the encapsulation layer on the flexible base substrate does not overlap with the orthographic projection of the corner portion on the flexible base substrate.

For example, the display substrate further includes a carrier layer disposed on a side of the flexible base substrate away from the display layer, and an orthographic projection of the carrier layer on the flexible base substrate does not overlap with the orthographic projection of the corner portion on the flexible base substrate.

For example, the display substrate further includes a plurality of isolation pillars, some of the plurality of isolation pillars are located in a position close to the corner portion in one side display area of two adjacent side display areas, the others of the plurality of isolation pillars are located in a position close to the corner portion in the other one side display area of the two adjacent side display areas.

For example, the corner portion includes a first sub-corner portion and a second sub-corner portion, the corner portion is configured to fold in half along a diagonal line of the corner portion, so that the first sub-corner portion overlaps with the second sub-corner portion.

For example, the corner portion folded in half is attached to a back surface of one side display area of two side display areas adjacent to the corner portion, the back surface is away from the side display surface, and an orthographic projection of the first sub-corner portion on the back surface overlaps with an orthographic projection of the second sub-corner portion on the back surface.

For example, the display substrate further includes a protective layer, the protective layer is located in the corner portion, and the protective layer covers the second wiring portion.

For example, the main display area is rectangular, the bending portion includes four side display areas, the four side display areas are respectively connected to four side edges of the main display area, and the four side display areas are all bent in the direction away from the main display surface.

For example, a bending angle of the four side display areas relative to the main display area is about 90°.

In another aspect, a display panel is provided, the display panel includes: a covering plate; and a display substrate that mentioned above, the display substrate is disposed opposite to the covering plate.

In yet another aspect, a method for manufacturing a display substrate is provided, including:

providing a flexible base substrate, wherein the flexible base substrate includes: a main display area; and a bending portion, wherein the bending portion is disposed around a periphery of the main display area, the bending portion is connected to the periphery of the main display area, and the bending portion includes: a plurality of side display areas, wherein each side display area is connected to a side edge of the main display area; and a plurality of corner portions, wherein each corner portion is connected to a turning of the main display area, each corner portion is located between two adjacent side display areas, and the plurality of side display areas and the plurality of corner portions extend continuously;

forming a display layer on the flexible base substrate, so that the main display area includes a main display surface, and each side display area of the plurality of the side display area includes a side display surface;

removing the display layer in the plurality of corner portions, so that the corner portions constitute a non-display area; and bending the bending portion including the plurality of side display areas and the plurality of corner portions in a direction away from the main display surface;

wherein the method further includes: in the process of bending the bending portion including the plurality of side display areas and the plurality of corner portions in a direction away from the main display surface, folding each corner portion in half along a diagonal line of each corner portion of the plurality of corner portions; and attaching each corner portion folded in half to a back surface of the side display area adjacent to each corner portion, wherein the back surface is away from the side display surface.

For example, the method further includes: forming a wiring on the flexible base substrate, so that the wiring includes a first wiring portion, a second wiring portion and a third wiring portion that are extend continuously, the first wiring portion is located in one side display area of two adjacent side display areas, the third wiring portion is located in the other one side display area of the two adjacent side display areas, and the second wiring portion is located in the corner portion between the two adjacent side display areas.

BRIEF DESCRIPTION OF THE DRAWINGS

In order to clearly describe technical solutions of the exemplary embodiments of the present disclosure, drawings of the embodiments will be briefly described below. It should be understood that the drawings described below only relate to some exemplary embodiments of the present disclosure, rather than limiting the present disclosure, wherein:

FIG. 9 is a flowchart of a method for manufacturing a display substrate according to the embodiments of the present disclosure;

Figure 1:
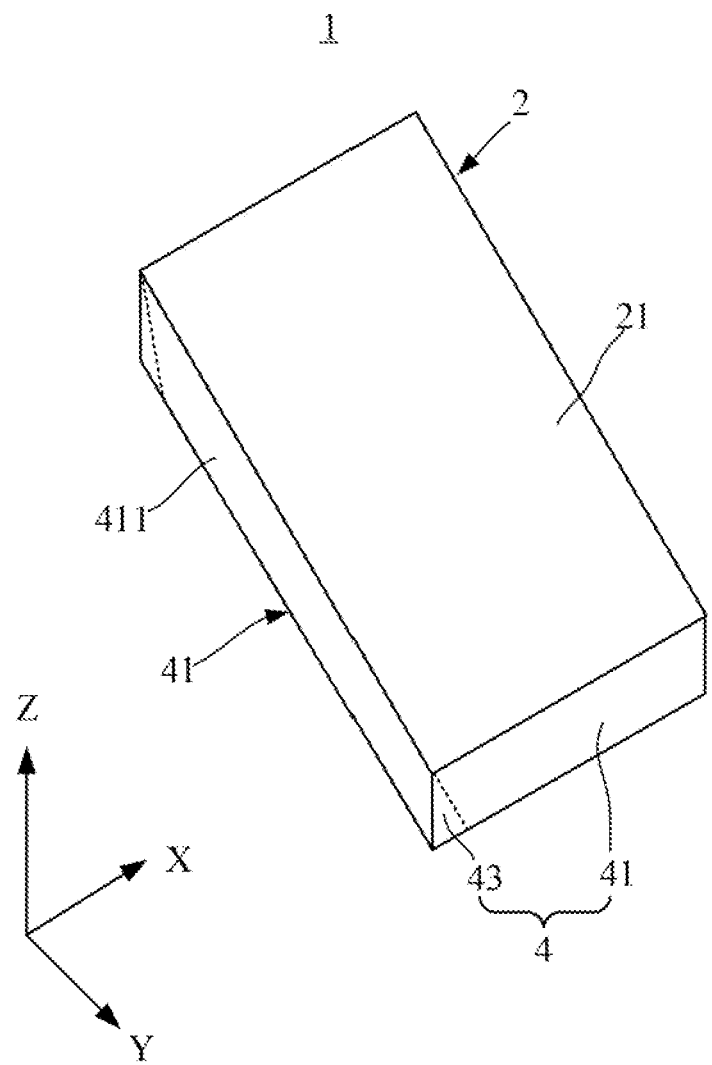
FIG. 1 is a schematic structural diagram of a display substrate according to the embodiments of the present disclosure.

It should be noted that, for clarity, in the drawings used to describe the embodiments of the present disclosure, sizes of layers, structures, or regions may be enlarged or reduced, that is, the drawings are not drawn according to actual scale.

DETAILED DESCRIPTION OF EMBODIMENTS

In the following, technical solutions of the present disclosure will be further described in detail through the embodiments and in conjunction with drawings. In the specification, the same or similar reference numerals indicate the same or similar components. The following description of the embodiments of the present disclosure with reference to the drawings is intended to explain a general inventive concept of the present disclosure, and should not be construed as a limitation to the present disclosure.

In addition, in the following detailed description, for convenience of explanation, many specific details are set forth to provide a comprehensive understanding of the embodiments of the present disclosure. However, obviously, one or more embodiments may also be implemented without the specific details.

It should be noted that the terms "on", "formed on" and "disposed on" in the present disclosure may mean that one layer is directly formed or disposed on another layer, and the terms may also mean that one layer is formed indirectly or disposed on another layer, that is, there are other layers between the two layers.

It should be noted that although terms "first", "second", etc. may be used here to describe various components, members, elements, regions, layers and/or parts. However, the components, members, elements, regions, layers and/or parts should not be limited by the terms. Rather, the terms are used to distinguish one component, member, element, region, layer and/or part from another component, member, element, region, layer and/or part. Thus, for example, the first component, the first member, the first element, the first region, the first layer and/or the first part discussed below may be referred to as the second component, the second member, the second element, the second region, the second layer and/or the second part without departing from teachings of the present disclosure.

In the present disclosure, unless otherwise specified, terms "located on the same layer", "disposed on the same layer" and the like used mean that two layers, components, members, structures, elements or parts may be formed by the same patterning process. And the two layers, components, members, elements or parts are generally formed of the same material.

In the present disclosure, unless otherwise specified, terms "dispose continuously" and "extend continuously" mean: two areas, parts or components extend, connect or dispose continuously and uninterruptedly, that is, the two areas, parts or components form an integral structure uninterruptedly.

In the present disclosure, for ease of description, an XYZ coordinate system is established. For example, a plane parallel to a display surface is defined as a XY plane. In the XY plane, one direction is defined as a X direction, the other direction perpendicular to the X direction is defined as a Y direction, and a direction perpendicular to the display surface is defined as Z direction. It should be pointed out that the expressions such as the XYZ coordinate system, the X direction, the Y direction, and the Z direction are only used for convenience of describing the embodiments of the present disclosure and should not be construed as limiting the present disclosure. Therefore, in the present disclosure, unless otherwise specified, directional terms such as "upper", "lower", "left", "right", "inner", "outer", the XYZ coordinate system, the X direction, the Y direction, the Z direction, etc. are used to indicate an orientation or a positional relationship shown in drawings. The directional terms are only for convenience of describing the present disclosure, and the directional terms do not indicate or imply that a device, an element, or a component must have a specific orientation and be configured or operated in a specific orientation. It should be understood that when an absolute position of a described object changes, a relative position relationship may also change accordingly. Therefore, the directional terms should not be construed as limiting the present disclosure.

In the present disclosure, unless otherwise specified, the term "diagonal line" refers to a line connecting any two non-adjacent vertices of a polygon.

Figure 2:
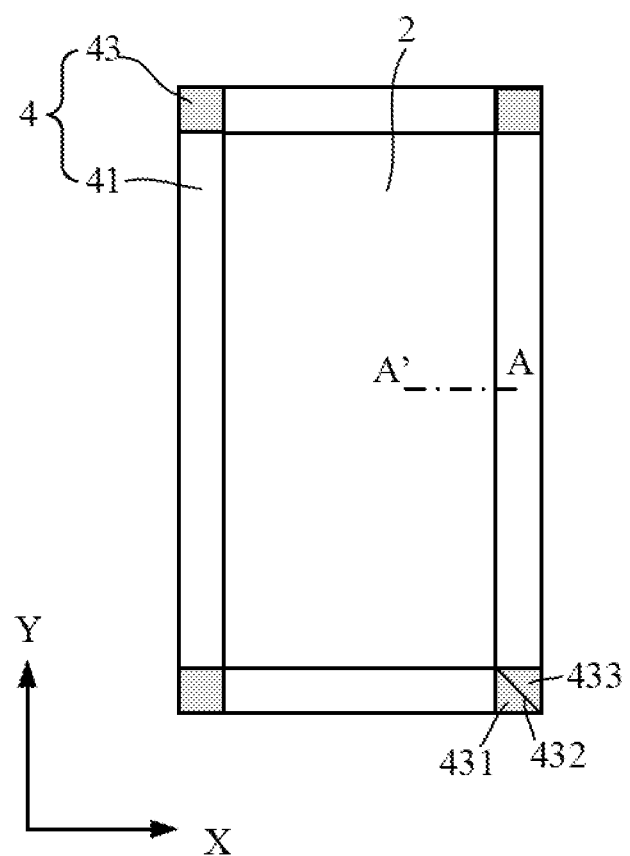
FIG. 2 is a plan view of the display substrate of FIG. 1 in an unfolded state.

FIG. 1 is a schematic structural diagram of a display substrate according to the embodiments of the present disclosure, and FIG. 2 is a plan view of the display substrate shown in FIG. 1 in an unfolded state. It should be noted that the display substrate in FIG. 1 is in a normal use state, that is, a bent state.

Referring to FIGS. 1 and 2 in combination, the display substrate 1 may include a main display area 2 and a bending portion 4. The main display area 2 includes a main display surface 21. The bending portion 4 is disposed around a periphery of the main display area 2. Specifically, the bending portion 4 is connected to the periphery of the main display area 2, and the bending portion 4 is bent in a direction away from the main display surface 21. In the present disclosure, the "periphery" of the main display area refers to an edge surrounding the main display area, and the periphery includes side edges of the main display area and corners between the side edges. For example, in a case where the main display area is a rectangle, the "periphery" of the main display area includes four side edges of the rectangle and four vertices of the rectangle (that is, corners between the four side edges).

As shown in FIG. 2, the bending portion 4 may include a side display area 41 and a corner portion 43. The bending portion 4 may include a plurality of side display areas 41, each side display area 41 is respectively connected to an side edge of the main display area 2, and each side display area 41 includes a side display surface 411. For example, the main display area 2 is a rectangle, the bending portion 4 may include four side display areas 41, and the four side display areas 41 are respectively connected to four side edges of the main display area 2. The bending portion 4 may include a plurality of corner portions 43. As shown in FIG. 2, each corner portion 43 is respectively connected to a turing of the main display area 2, that is, each corner portion 43 is located at a corner of the main display area 2, and each corner portion 43 is located between two adjacent side display areas 41 to connect the two adjacent side display areas 41. For example, the bending portion 4 may include four corner portions 43, and the four corner portions 43 are respectively connected to the four corners (that is, vertices) of the main display area 2. In this way, the side display areas 41 and the corner portions 43 are alternately disposed at the periphery of the main display area 2, and the side display areas 41 and the corner portions 43 extend continuously to form the continuously extending bending portion 4 surrounding the periphery of the main display area 2.

In the embodiments of the present disclosure, both the main display area 2 and the side display area 41 are configured as display areas to display information such as texts, images, and videos together. The corner portion 43 is configured as a non-display area, and the corner portion is convenient for providing structures such as wirings. Moreover, each side display area 41 around the main display area 2 may be bent in the direction away from the main display surface 21 to form the display substrate with four or more bent sides.

For example, referring to FIG. 2, the main display area 2 is a rectangle, that is, an orthographic projection of the main display area 2 in a XY plane is a rectangle, wherein the XY plane is a plane parallel to the main display surface 21. A size of the rectangle in a X direction is X1, and a size of the rectangle in a Y direction is Y1. The X direction and the Y direction are two directions in the XY plane perpendicular to each other. An area of the main display surface 21 is X1×Y1.

Continuing to refer to FIG. 2, when the display substrate 1 is in an unfolded state, orthographic projection of both an entirety of the main display area 2 and the bending portion 4 in the XY plane is also a rectangle. A size of the rectangle in the X direction is X2, a size of the rectangle in the Y direction is Y2, and X2>X1, Y2>Y1. Specifically, orthographic projections of each side display area 41 and each corner portion 43 in the XY plane are also rectangles.

In this way, two side display areas 41 (that is, two side display areas 41 located on left and right side in FIG. 2) disposed at both side edges of the main display area 2 in the X direction have a length of Y1 and a width of (X2−X1)/2, and two side display areas 41 (that is, two side display areas 41 located on upper and lower sides in FIG. 2) disposed at both side edges of the main display area 2 in the Y direction have a length of X1 and a width of (Y2−Y1)/2. A sum of areas of the four side display areas 41 is Y1×(X2−X1)+X1×(Y2−Y1). In the embodiments of the present disclosure, a total area of the display area of the display substrate 1 is: X1×Y1+Y1×(X2−X1)+X1×(Y2−Y1). It could be seen that the display area of the display substrate is greatly expanded, which is beneficial to an implement of large-screen display and full-screen display.

Optionally, the width of each side display area 41 may be the same, that is, X2−X1 may be equal to Y2−Y1. In this case, in the unfolded state shown in FIG. 2, the orthographic projection of each corner portion 43 in the XY plane is a square.

Figure 3:
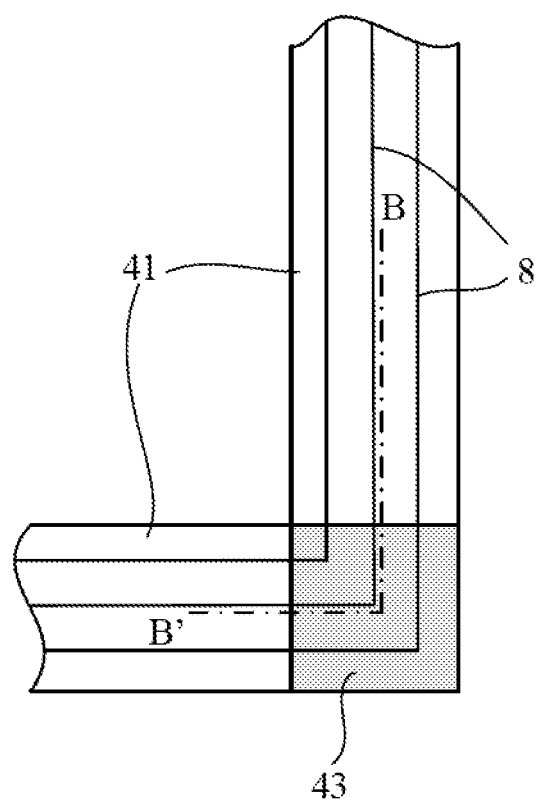
FIG. 3 is a partial enlarged view of one corner portion of the display substrate of FIG. 2.

FIG. 3 is a partial enlarged view of one corner portion of the display substrate of FIG. 2. Referring to FIGS. 2 and 3, each corner portion 43 located at each turning is retained, that is, there is no need to remove each corner portion, which facilitates a simplification of a manufacturing process of the display substrate with four bent sides. In addition, the display substrate 1 may include a plurality of wirings 8, and the wiring 8 may extend from one side display area 41 to another side display area 41 through the corner portion 43, that is, a part of the wiring 8 may be disposed on each corner portion 43. In this way, the wiring does not need to be disposed in a corner of the display area, which facilitates a layout of the wiring and facilitates narrowing of a border.

Figure 4:
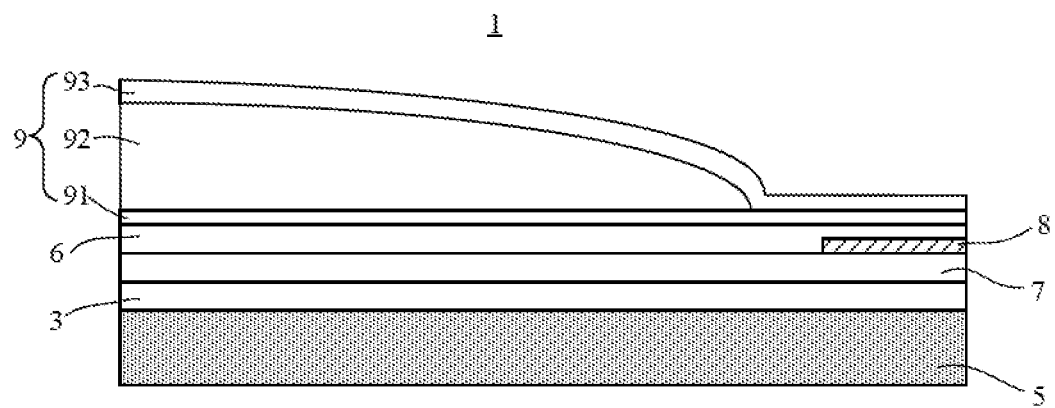
FIG. 4 is a cross-sectional view of the display substrate taken along line AA' in FIG. 2 according to the embodiments of the present disclosure.
Figure 5:
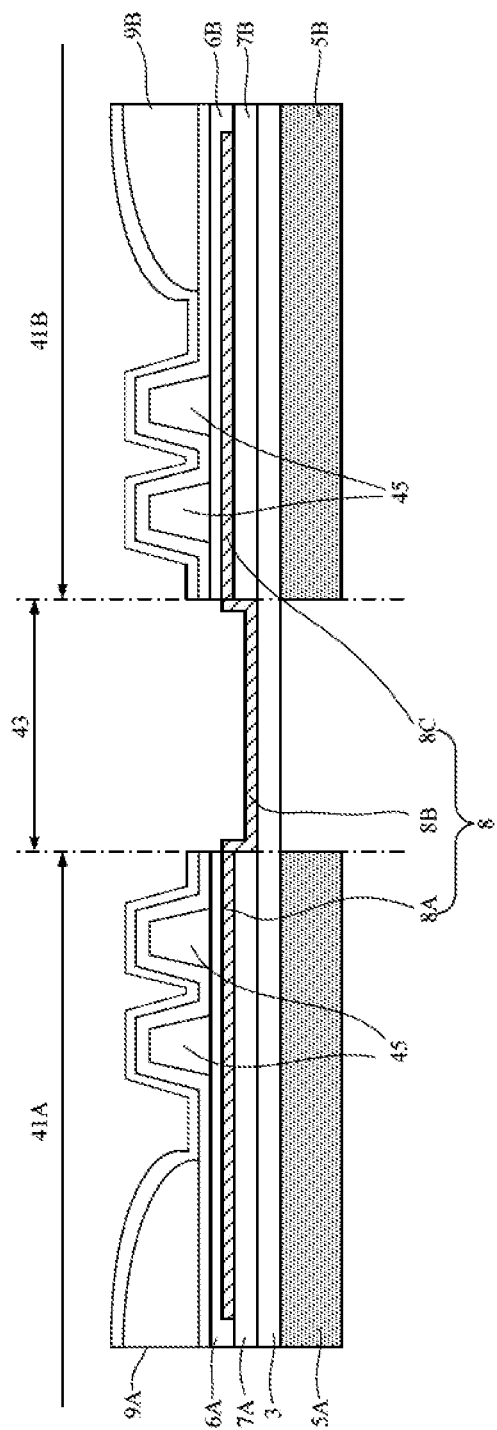
FIG. 5 is a cross-sectional view of the display substrate taken along line BB' in FIG. 3 according to the embodiments of the present disclosure.

FIG. 4 is a cross-sectional view of the display substrate taken along line AA' in FIG. 2 according to the embodiments of the present disclosure, and FIG. 5 is a cross-sectional view of the display substrate taken along line BB' in FIG. 3 according to the embodiments of the present disclosure. With reference to FIGS. 2, 4 and 5 in combination, the display substrate 1 may include a carrier layer 5, a base substrate 3, a display layer 6, a buffer layer 7, a wiring 8 and an encapsulation layer 9 that are stacked. It should be noted that the display substrate may also include other film layers, for example, a circuit layer including a thin film transistor, an interlayer insulating layer or other insulating layers. In order to simplify the drawings, the other film layers are not shown in the drawings, and the embodiments of the present disclosure are not limited to the embodiments of the drawings.

Referring to FIGS. 4 and 5, the base substrate 3 is disposed in the display area including the main display area 2 and each side display area 41, and the base substrate 3 is also disposed in the corner portion 43 (i.e, the non-display area). The carrier layer 5, the display layer 6, the buffer layer 7 and the encapsulation layer 9 are only disposed in the display area including the main display area 2 and each side display areas 41 and are not disposed in the corner portion 43 (i.e, the non-display areas). In other words, an orthographic projection of any one of the carrier layer 5, the display layer 6, the buffer layer 7 and the encapsulation layer 9 on the base substrate 3 overlaps with an orthographic projection of the display area including the main display area 2 and each side display area 41 on the base substrate 3. However, the orthographic projection of any one of the carrier layer 5, the display layer 6, the buffer layer 7 and the encapsulation layer 9 on the base substrate 3 does not overlap with an orthographic projection of the corner portion 43 on the base substrate 3.

In the embodiments of the present disclosure, the base substrate 3 may be a flexible base substrate, such as a flexible base substrate made of PI material. A thickness of the base substrate 3 may be relatively thin, for example, about 20 μm. In this way, the base substrate 3 may be prone to bent.

Further, referring to FIG. 5, FIG. 5 illustrates a partial cross-sectional view of two adjacent side display areas 41 and a corner portion 43 between the two adjacent side display areas 41. For ease of description, the two adjacent side display areas 41 are marked as side display areas 41A and 41B.

The carrier layer 5 is disposed on a side of the base substrate 3 (lower side in FIG. 5), and the carrier layer 5 includes a first carrier sublayer 5A in the side display area 41A and a second carrier sublayer 5B in the side display area 41B. The carrier layer 5 is not disposed in the corner portion 43. The carrier layer 5 is configured to support the base substrate 3, for example, the carrier layer 5 may be a PET layer with a thickness of about 100 μm.

The buffer layer 7 is disposed on a side of the base substrate 3 away from the carrier layer 5 (upper side in FIG. 5). The buffer layer 7 includes a first buffer sublayer 7A in the side display area 41A and a second buffer sublayer 7B in the side display area 41B. The buffer layer 7 is not disposed in the corner portion 43. The buffer layer 7 may include an inorganic material layer such as silicon nitride.

The display layer 6 is disposed on a side of the buffer layer 7 away from the base substrate 3, and the display layer 6 includes a first display sublayer 6A in the side display area 41A and a second display sublayer 6B in the side display area 41B. The display layer 6 is not disposed in the corner portion 43. For example, the display layer 6 may include an OLED device layer, that is, the display layer 6 may include an anode, a cathode, and an organic light-emitting layer between the anode and the cathode.

The encapsulation layer 9 is disposed on a side of the display layer 6 away from the base substrate 3. The encapsulation layer 9 includes a first encapsulation sublayer 9A in the side display area 41A and a second encapsulation sublayer 9B in the side display area 41B. The encapsulation layer 9 is not disposed in the corner portion 43. For example, the encapsulation layer 9 may include a film layer formed alternately of an inorganic layer and an organic layer. Specifically, the encapsulation layer 9 may include a first inorganic encapsulation layer 91, an organic encapsulation layer 92, and a second inorganic encapsulation layer 93 that are sequentially disposed. The organic encapsulation layer 92 is located between the first inorganic encapsulation layer 91 and the second inorganic encapsulation layer 93. The first inorganic encapsulation layer 91, the organic encapsulation layer 92 and the second inorganic encapsulation layer 93 all cover the display layer 6 to protect devices in the display layer 6 from corrosion by water and oxygen.

The wiring 8 is disposed between the buffer layer 7 and the display layer 6. The wiring 8 includes a first wiring portion 8A in the side display area 41A, a second wiring portion 8B in the corner portion 43 and a third wiring portion 8C in the side display area 41B. The first wiring portion 8A, the second wiring portion 8B and the third wiring portion 8C extend continuously to form the complete wiring 8.

Figure 6:
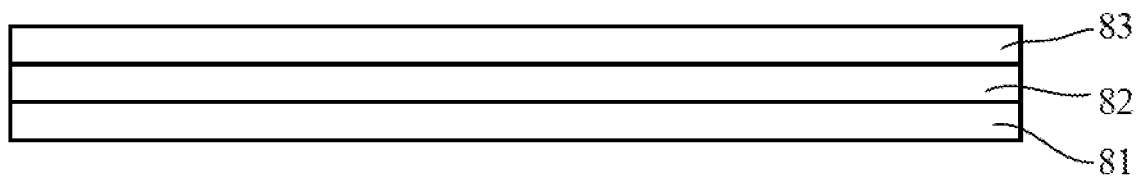
FIG. 6 is a stacked structure diagram of a wiring of a display substrate according to the embodiments of the present disclosure.

For example, the wiring 8 may have a stacked structure of Ti/Al/Ti, that is, as shown in FIG. 6, the wiring 8 may include a Ti layer 81, an Al layer 82 and a Ti layer 83 that are stacked.

In the embodiments of the present disclosure, only the base substrate 3 and the wiring 8 are disposed in the corner portion 43, the wiring 8 is directly located on the base substrate 3, that is, the wiring 8 contacts a surface of the base substrate 3 where the display layer 6 and other film layers are disposed. In other words, the first wiring portion 8A and the third wiring portion 8C contact a surface of the buffer layer 7 away from the base substrate 3, and the second wiring portion 8B contacts the surface of the base substrate 3. Through such a design, it is beneficial to bend or fold the corner portion while facilitating the layout of the wiring.

Further referring to FIG. 5, the display substrate 1 may further include a plurality of isolation pillars 45 adjacent to the corner portion 43. Specifically, two isolation pillars 45 are disposed on a side of the side display area 41A adjacent to the corner portion 43, and two isolation pillars 45 are disposed on a side of the side display area 41B adjacent to the corner portion 43. Although the encapsulation layer 9 is interrupted at the corner portion 43, by designing the plurality of isolation pillars 45, an intrusion path of water and oxygen may be extended to achieve a purpose of blocking the intrusion of water and oxygen.

Figure 7:
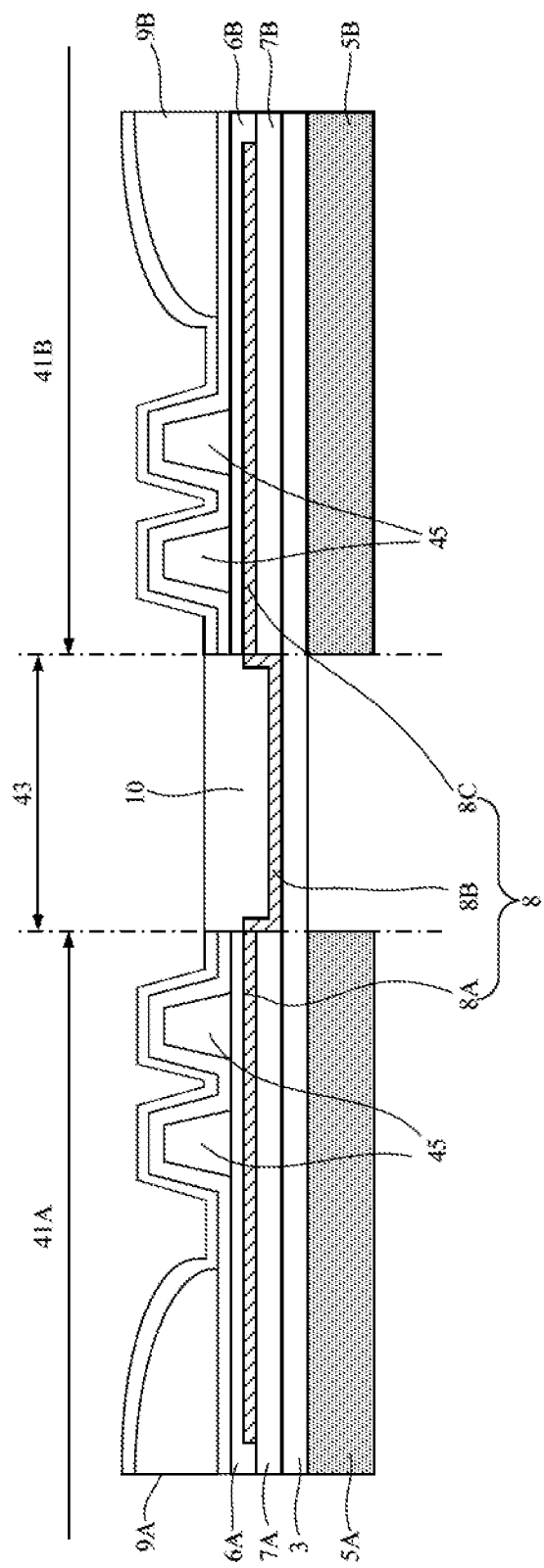
FIG. 7 is a cross-sectional view of the display substrate taken along line BB' in FIG. 3 according to the embodiments of the present disclosure, wherein the display substrate includes a protective layer that covering a wiring.

Optionally, referring to FIG. 7, in the corner portion 43, a protective layer 10 is disposed. The protective layer 10 is disposed on a side of the wiring 8 away from the base substrate 3, and the protective layer 10 directly contacts the wiring 8 to cover the wiring 8. In this way, when the corner portion 43 is folded, the wiring 8 may be protected and a risk of the wiring being broken may be reduced. For example, the protective layer 10 may be composed of an organic material.

Hereinafter, a bending process of the display substrate will be further described in conjunction with the drawings.

Referring back to FIGS. 2 and 3, the orthographic projection of each corner portion 43 in the XY plane is a rectangle, such as a square. Each corner portion 43 may include two diagonal lines, an extension line of one diagonal line of the two diagonal lines passes through the main display area 2, and an extension line of the other one diagonal line of the two diagonal lines does not pass through the main display area 2. As shown in FIG. 2, an extension of a diagonal line 432 of the corner portion 43 passes through the main display area 2. In this way, each corner portion 43 may include a first sub-corner portion 431 and a second sub-corner portion 433 that are respectively located on both sides of the diagonal line 432.

Figure 8A:
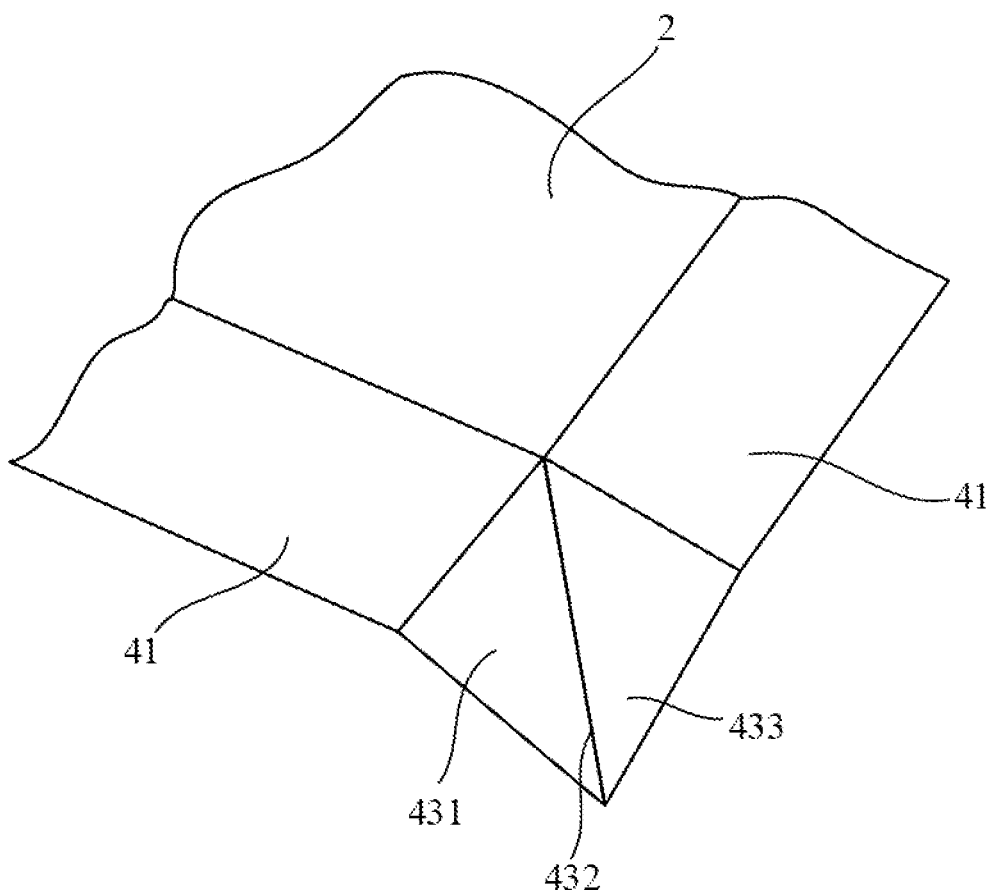
FIG. 8A is a partial schematic view of a corner portion of a display substrate according to the embodiments of the present disclosure viewed from outside, which illustrates an intermediate process of folding a corner portion in half along a diagonal line of the corner portion.

The corner portion 43 may be folded in half along the diagonal line 432. FIG. 8A is a partial schematic view of one corner of a display substrate viewed from outside, and FIG. 8A illustrates an intermediate process in which the corner portion 43 may be folded in half along the diagonal line 432 of the corner portion 43. It should be understood that a square may be folded in half along its diagonal line to form a triangle. That is, the corner portion 43 may be folded in half along the diagonal line 432, so that the first sub-corner portion 431 and the second sub-corner portion 433 completely overlap. It should be understood that each of the first sub-corner portion 431 and the second sub-corner portion 433 is a triangular.

Figure 8B:
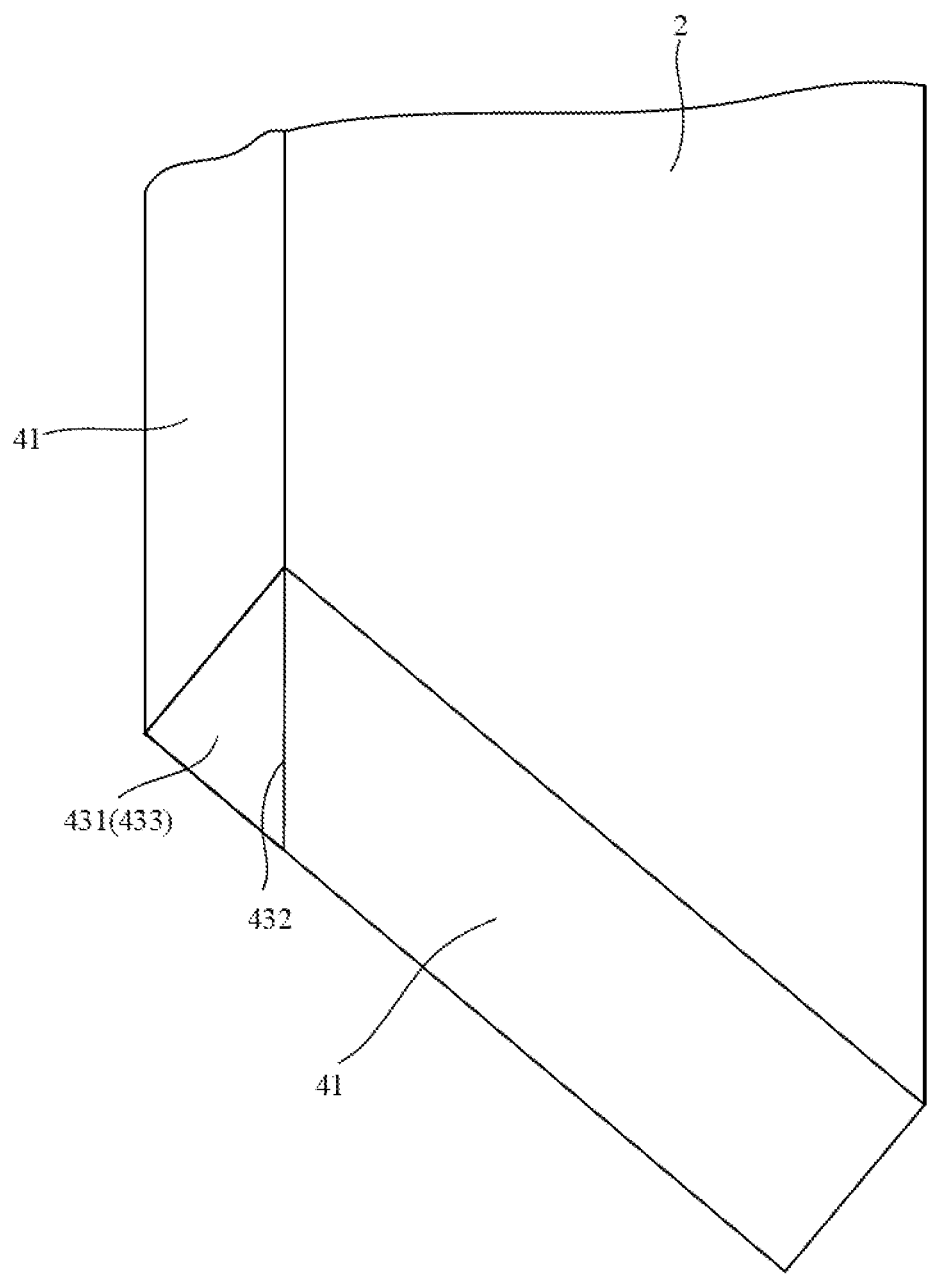
FIG. 8B is a partial schematic view of a corner portion of a display substrate according to the embodiments of the present disclosure viewed from inside.

FIG. 8B is a partial schematic view of one corner of a display substrate viewed from inside. As shown in FIG. 8B, the corner portion 43 folded in half may be attached to a back surface of a side display area 41 adjacent to the corner portion 43, that is, a surface of the side display area 41 away from a side display surface thereof. In a process of folding the corner portion 43, referring to FIG. 1 and FIG. 8B in combination, each side display area 41 is bent relative to the main display area 2. For example, each side display area 41 may be bent at an angle of about 90° relative to the main display area 2. More specifically, in a process of bending each side display area 41 relative to the main display area 2, each corner portion is folded in half, and each folded corner portion is attached to the back surface of the side display area 41 adjacent to the corner portion 43 by, for example, adhesive. Thus, the display substrate with four bent sides as shown in FIG. 1 is formed.

In the embodiments of the present disclosure, the non-display areas at the corner portions are folded in half and bent to the back surface of each side display area, surfaces facing the user are all display surfaces (including the main display surface and each side display surface), thereby implementing a full screen with four bent sides. In addition, during the bending process, there is no need to cut off each corner portion, which is beneficial to the manufacturing process, and the wiring may be disposed at the corner portion, which is beneficial to the layout of a wiring path. In addition, at the corner portion, the wiring is sandwiched between the flexible base substrate and the elastic protective layer, which may reduce a risk of bending and breaking the wiring.

Further, the embodiments of the present disclosure also provide a method for manufacturing a display substrate. Referring to FIG. 9, the method may be performed in the following steps. It should be noted that, according to some embodiments of the present disclosure, some of the following steps may be performed individually or in combination, and the following steps may be performed in parallel or sequentially. The following steps are not limited to the specific operation sequence described below.

In step S91, a base substrate 3 is provided, the base substrate 3 includes: a main display area 2; and a bending portion 4, wherein the bending portion 4 is disposed around a periphery of the main display area 2, the bending portion 4 is connected to the periphery of the main display area 2, and the bending portion 4 includes: a plurality of side display areas 41, each side display area 41 is connected to a side edge of the main display area 2; and a plurality of corner portions 43, each corner portion 43 is connected to a turning of the main display area 2, and each corner portion 43 is located between two adjacent side display areas 41. The plurality of side display areas 41 and the plurality of corner portions 43 extend continuously.

In step S92, a display layer 6 is formed on the base substrate 3, so that the main display area 2 includes a main display surface 21, and each side display area 41 of the plurality of side display areas 41 includes a side display surface 411.

In step S93, the display layer 6 in the plurality of corner portions 43 is removed, so that the corner portion 43 constitutes a non-display area.

In step S94, the bending portion 4 including the plurality of side display areas 41 and the plurality of corner portions 43 is bent in a direction away from the main display surface 21.

In the embodiments of the present disclosure, in the process that the bending portion 4 including the plurality of side display areas 41 and the plurality of corner portions 43 is bent in the direction away from the main display surface 21, each corner portion 43 is folded in half along a diagonal line of each corner portion 43 of the plurality of corner portions 43; and each corner portion 43 folded in half is attached to a back surface of the side display area 41 adjacent to each corner portion 43, and the back surface is away from the side display surface 411.

Optionally, the method further includes: a wiring 8 is formed on the base substrate 3, so that the wiring includes a first wiring portion 8A, a second wiring portion 8B and a third wiring portion 8C that are extend continuously, the first wiring portion is located in one side display area of two adjacent side display areas, the third wiring portion is located in the other one side display area of the two adjacent side display areas, and the second wiring portion is located in the corner portion between the two adjacent side display areas.

Figure 10:
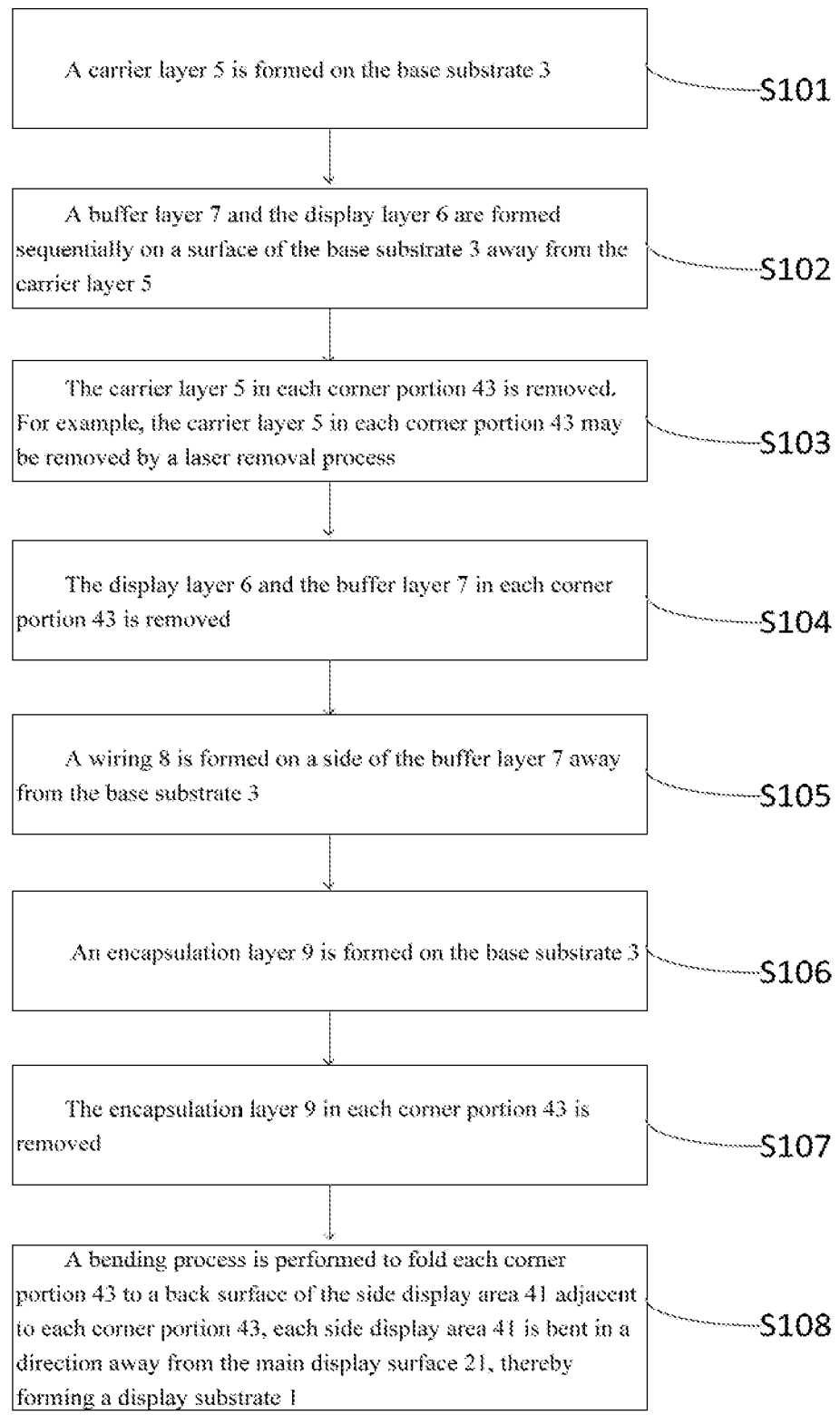
FIG. 10 is a flowchart schematically illustrating a specific implementation of a method for manufacturing a display substrate according to the embodiments of the present disclosure.

More specifically, referring to FIG. 10, the method for manufacturing a display substrate according to the embodiments of the present disclosure may be performed according to the following steps.

In step S101, a carrier layer 5 is formed on the base substrate 3. For example, the carrier layer 5 may cover an entire lower surface of the base substrate 3.

In step S102, a buffer layer 7 and the display layer 6 are sequentially formed on a surface of the base substrate 3 away from the carrier layer 5.

In step S103, the carrier layer 5 in each corner portion 43 is removed. For example, the carrier layer 5 in each corner portion 43 may be removed by a laser removal process.

In step S104, the display layer 6 and the buffer layer 7 in each corner portion 43 is removed. For example, the display layer 6 and the buffer layer 7 in each corner portion 43 may be removed by an etching process. It should be noted that the step S104 may be performed in combination with the step S102. That is, in the process of forming the display layer 6 and the buffer layer 7, a patterning process including the etching process or the like may be used to remove the display layer 6 and the buffer layer 7 in each corner portion 43.

In step S105, a wiring 8 is formed on a side of the buffer layer 7 away from the base substrate 3. Referring to FIG. 5, the wiring 8 extends from a side display area 41A to an adjacent side display area 41B through the corner portion 43. That is, the wiring 8 includes a first wiring portion 8A in the side display area 41A, a second wiring portion 8B in the corner portion 43 and a third wiring portion 8C in the side display area 41B. The first wiring portion 8A, the second wiring portion 8B and the third wiring portion 8C extend continuously.

In step S106, an encapsulation layer 9 is formed on the base substrate 3.

In step S107, the encapsulation layer 9 in each corner portion 43 is removed. For example, the encapsulation layer 9 in each corner portion 43 may be removed by an etching process. It should be noted that the step S107 may be performed in combination with the step S106. That is, in the process of forming the encapsulation layer 9, the patterning process including the etching process or the like may be used to remove the encapsulation layer 9 in each corner portion 43.

In step S108, the above-mentioned bending process is performed to fold each corner portion 43 to the back surface of the side display area 41 adjacent to each corner portion 43, and each side display area 41 is bent in the direction away from the main display surface 21, thereby forming the display substrate 1 shown in FIG. 1.

Figure 11:
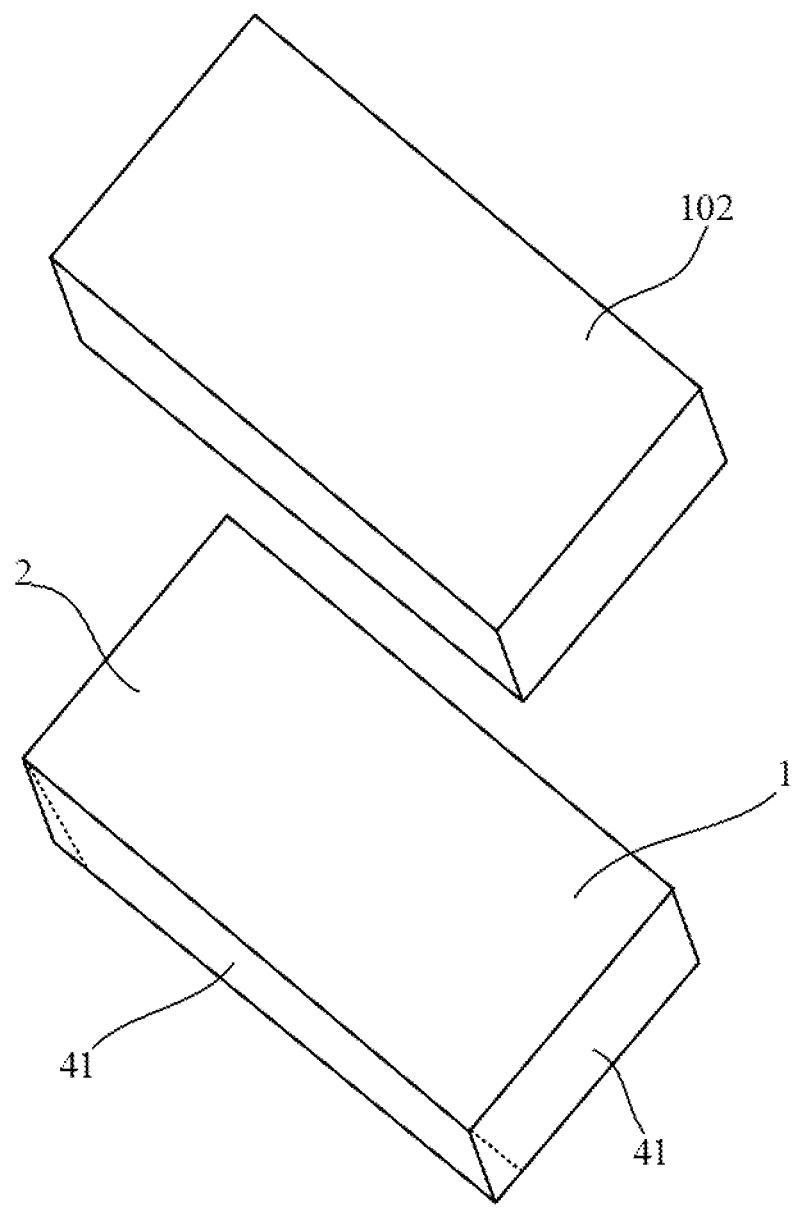
FIG. 11 is a schematic structural diagram of a display panel according to the embodiments of the present disclosure.

The embodiments of the present disclosure also provide a display panel. As shown in FIG. 11, the display panel 100 includes a display substrate 1 and a covering plate 102 that are disposed oppositely, and the display substrate 1 is a display substrate according to any one of the above embodiments.

For example, the covering plate 102 may include a plurality of covering surfaces, and the plurality of covering surfaces may include a main covering surface that covers a main display area 2 and side covering surfaces that cover side display areas 41. Corresponding to the above-mentioned display substrate 1, the covering plate 102 may include a structure in which four side covering surfaces are perpendicular to a main cover surface.

The embodiments of the present disclosure also provide a display device, including the display substrate or the display panel provided in any of the foregoing embodiments. For example, the display device may be any product or component with a display function, such as a smart phone, a wearable smart watch, smart glasses, a tablet computer, a television, a display, a laptop computer, a digital photo frame, a navigator, a car monitor, an e-book, etc. For example, the display device may be an organic light-emitting diode (OLED) display device.

The display device may be a full-screen display device with four bent sides. In the embodiments of the present disclosure, the display device may display information in a full screen, and the display device has a larger screen-to-body ratio. For example, the display device may also include functional devices such as a camera module and a proximity sensor, etc., and the functional devices may be hidden under the display panel of the display device. In addition, the display device may also include a fingerprint recognition module, which may be disposed on a back surface of the display device or under the display panel of the display device to form an under-screen fingerprint recognition module.

Although some embodiments of the general concept of the present disclosure have been illustrated and described, those skilled in the art will understand that changes may be made to the embodiments without departing from the principle and spirit of the general concept of the present disclosure. The scope of disclosure is defined by claims and their equivalents.

What is claimed is:

1. A display substrate, comprising:
   a main display area, wherein the main display area comprises a main display surface; and
   a bending portion, wherein the bending portion is disposed around a periphery of the main display area, the bending portion is connected to the periphery of the main display area, and the bending portion is bent in a direction away from the main display surface,
   wherein the bending portion comprises:
   a plurality of side display areas, wherein each side display area is connected to a side edge of the main display area, and each side display area comprises a side display surface; and
   a plurality of corner portions, wherein each corner portion is connected to a turning of the main display area, and each corner portion is located between two adjacent side display areas, and
   wherein the main display surface and the side display surfaces together constitute a display area, the corner portions constitute a non-display area, and the plurality of side display areas and the plurality of corner portions extend continuously;
   wherein the display substrate comprises a flexible base substrate and a wiring on the flexible base substrate, the wiring comprises a first wiring portion, a second wiring portion and a third wiring portion that are extend continuously, the first wiring portion is located in one side display area of two adjacent side display areas, the third wiring portion is located in the other one side display area of the two adjacent side display areas, and the second wiring portion is located in the corner portion between the two adjacent side display areas; and
   wherein the display substrate further comprises a plurality of isolation pillars, some of the plurality of isolation pillars are located in position of one side display area of two adjacent side display areas adjacent to the corner portion, the others of the plurality of isolation pillars are located in a position in the other one side display area of the two adjacent side display areas adjacent to the corner portion.

2. The display substrate of claim 1, wherein the display substrate further comprises a buffer layer on the flexible base substrate, and an orthographic projection of the buffer layer on the flexible base substrate does not overlap with an orthographic projection of the corner portion on the flexible base substrate.

3. The display substrate of claim 2, wherein the first wiring portion and the third wiring portion contact a surface of the buffer layer away from the flexible base substrate, and the second wiring portion contacts a surface of the flexible base substrate.

4. The display substrate of claim 2, wherein the display substrate further comprises a display layer on the flexible base substrate and an encapsulation layer on a side of the display layer away from the flexible base substrate, and an orthographic projection of each of the display layer and the encapsulation layer on the flexible base substrate does not overlap with the orthographic projection of the corner portion on the flexible base substrate.

5. The display substrate of claim 4, wherein the display substrate further comprises a carrier layer disposed on a side of the flexible base substrate away from the display layer, and an orthographic projection of the carrier layer on the flexible base substrate does not overlap with the orthographic projection of the corner portion on the flexible base substrate.

6. The display substrate of claim 1, wherein the corner portion comprises a first sub-corner portion and a second sub-corner portion, the corner portion is configured to fold in half along a diagonal line of the corner portion, so that the first sub-corner portion overlaps with the second sub-corner portion.

7. The display substrate of claim 6, wherein the corner portion folded in half is attached to a back surface of one side display area of the two side display areas adjacent to the corner portion, the back surface is away from the side display surface, and an orthographic projection of the first sub-corner portion on the back surface overlaps with an orthographic projection of the second sub-corner portion on the back surface.

8. The display substrate of claim 1, wherein the display substrate further comprises a protective layer, the protective layer is located in the corner portion, and the protective layer covers the second wiring portion.

9. The display substrate of claim 1, wherein the main display area is rectangular, the bending portion comprises four side display areas, the four side display areas are respectively connected to four side edges of the main display area, and the four side display areas are all bent in the direction away from the main display surface.

10. The display substrate of claim 9, wherein bending angles of the four side display areas relative to the main display area are all about 90°.

11. A display panel, comprising:
a covering plate; and
a display substrate opposite to the covering plate, wherein the display substrate is the display substrate of claim 1.

12. A method for manufacturing a display substrate, comprising:
providing a flexible base substrate, wherein the flexible base substrate comprises: a main display area; and a bending portion, wherein the bending portion is disposed around a periphery of the main display area, the bending portion is connected to the periphery of the main display area, and the bending portion comprises: a plurality of side display areas, wherein each side display area is connected to a side edge of the main display area; and a plurality of corner portions, wherein each corner portion is connected to a turning of the main display area, each corner portion is located between two adjacent side display areas, and the plurality of side display areas and the plurality of corner portions extend continuously;
forming a display layer on the flexible base substrate, so that the main display area comprises a main display surface, and each side display area of the plurality of the side display area comprises a side display surface;
removing the display layer in the plurality of corner portions, so that the corner portions constitute a non-display area; and
bending the bending portion comprising the plurality of side display areas and the plurality of corner portions in a direction away from the main display surface;
wherein the method further comprises: in the process of bending the bending portion comprising the plurality of side display areas and the plurality of corner portions in a direction away from the main display surface, folding each corner portion in half along a diagonal line of each corner portion of the plurality of corner portions; and attaching each corner portion folded in half to a back surface of the side display area adjacent to each corner portion, wherein the back surface is away from the side display surface;
wherein the method further comprises: forming a wiring on the flexible base substrate, so that the wiring comprises a first wiring portion, a second wiring portion and a third wiring portion that are extend continuously, wherein the first wiring portion is located in one side display area of two adjacent side display areas, the third wiring portion is located in the other one side display area of the two adjacent side display areas, and the second wiring portion is located in the corner portion between the two adjacent side display areas; and
wherein the method further comprises: forming a plurality of isolation pillars, some of the plurality of isolation pillars are located in a position adjacent to the corner portion in one side display area of two adjacent side display areas, and the others of the plurality of isolation pillars are located in a position adjacent to the corner portion in the other one side display area of the two adjacent side display areas.

13. The display substrate of claim 3, wherein the display substrate further comprises a display layer on the flexible base substrate and an encapsulation layer on a side of the display layer away from the flexible base substrate, and an orthographic projection of each of the display layer and the encapsulation layer on the flexible base substrate does not overlap with the orthographic projection of the corner portion on the flexible base substrate.

\* \* \* \* \*